US012603199B2

(12) United States Patent
Fu et al.

(10) Patent No.: US 12,603,199 B2
(45) Date of Patent: Apr. 14, 2026

(54) METHOD FOR IMPROVING ANTI-REDUCTION PERFORMANCE OF PTC THERMOSENSITIVE ELEMENT

(71) Applicant: JIANGSU NEW LINZHI ELECTRONIC TECHNOLOGY CO., LTD., Suqian (CN)

(72) Inventors: Qiuyun Fu, Suqian (CN); Zhengan He, Suqian (CN); Dongxiang Zhou, Suqian (CN)

(73) Assignee: JIANGSU NEW LINZHI ELECTRONIC TECHNOLOGY CO., LTD., Suqian (CN)

( * ) Notice: Subject to any disclaimer, the term of this patent is extended or adjusted under 35 U.S.C. 154(b) by 36 days.

(21) Appl. No.: 18/822,692

(22) Filed: Sep. 3, 2024

(65) Prior Publication Data

US 2024/0428967 A1     Dec. 26, 2024

Related U.S. Application Data

(63) Continuation of application No. PCT/CN2022/083214, filed on Mar. 26, 2022.

(30) Foreign Application Priority Data

Mar. 10, 2022     (CN) .......................... 202210227826.6

(51) Int. Cl.
  *H01C 7/00*          (2006.01)
  *C23C 14/02*          (2006.01)
    (Continued)

(52) U.S. Cl.
  CPC ........... *H01C 17/30* (2013.01); *C23C 14/021* (2013.01); *C23C 14/08* (2013.01); *C23C 14/081* (2013.01);
    (Continued)

(58) Field of Classification Search
  CPC .................................. G01C 7/00; H01C 7/00
  See application file for complete search history.

(56) References Cited

U.S. PATENT DOCUMENTS

2008/0099456 A1*   5/2008   Schwenke .............. B41J 3/4073
                                                              222/146.2

FOREIGN PATENT DOCUMENTS

CN          1113026 A       12/1995
CN          1366311 A       8/2002
              (Continued)

OTHER PUBLICATIONS

JP2010272271A, English Translated, (Year: 2010).*
    (Continued)

*Primary Examiner* — Gordon Baldwin
*Assistant Examiner* — Mohammad Mayy
(74) *Attorney, Agent, or Firm* — HOWARD M COHN and Associates, LLC

(57) ABSTRACT

Disclosed is a method for improving anti-reduction performance of a PTC thermosensitive element, including coating an inorganic protective layer, organic protective layer, or organic and inorganic composite protective layer coated with a mixture of an inorganic substance and an organic substance for blocking harmful reducing gases from entering an interior of a ceramic body through surface defects or grain boundaries of the ceramic body onto the surface of a PTC thermosensitive element based on barium lead titanate. Advantages: by coating the inorganic protective layer, organic protective layer, or organic and inorganic composite protective layer coated with the mixture of the inorganic substance and the organic substance onto the surface of the PTC thermosensitive element based on barium lead titanate to form an isolation protective layer for blocking reducing harmful gases from entering the interior of the ceramic body through the surface defects or grain boundaries of the ceramic body.

12 Claims, 1 Drawing Sheet

(51) Int. Cl.

| | | |
|---|---|---|
| *C23C 14/08* | (2006.01) | |
| *C23C 14/34* | (2006.01) | |
| *C23C 14/58* | (2006.01) | |
| *C23C 24/10* | (2006.01) | |
| *H01C 17/30* | (2006.01) | |

(52) U.S. Cl.
CPC ............ *C23C 14/082* (2013.01); *C23C 14/34* (2013.01); *C23C 14/5806* (2013.01); *C23C 24/10* (2013.01)

(56) References Cited

FOREIGN PATENT DOCUMENTS

| | | | |
|---|---|---|---|
| CN | 2537109 | Y | 2/2003 |
| CN | 101022046 | A | 8/2007 |
| CN | 112802647 | A | 5/2021 |
| CN | 113265636 | A | 8/2021 |
| CN | 112802674 | B | 4/2023 |
| EP | 0994491 | A2 | 4/2000 |
| JP | 2006054258 | A | 2/2006 |
| JP | 2008306086 | A | 12/2008 |
| JP | 2010272271 | A * | 12/2010 |

OTHER PUBLICATIONS

International Search Report issued in corresponding International application No. PCT/CN2022/083214, mailed Dec. 2, 2022.
Written Opinion of the International Search Authority in corresponding International application No. PCT/CN2022/083214, mailed Dec. 2, 2022.

* cited by examiner

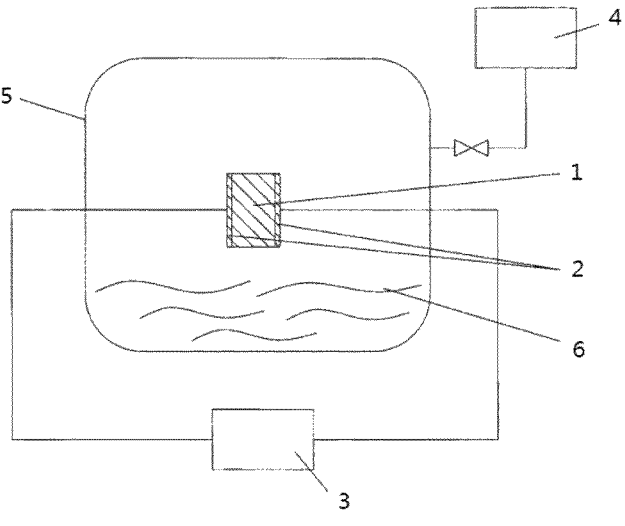

METHOD FOR IMPROVING ANTI-REDUCTION PERFORMANCE OF PTC THERMOSENSITIVE ELEMENT

TECHNICAL FIELD

The present disclosure belongs to the technical field of electronic component preparation, and particularly relates to a method for improving anti-reduction performance of a PTC thermosensitive element.

BACKGROUND

PTC mentioned above is the abbreviation for "Positive Temperature Coefficient" in English. PTC thermosensitive element mainly refers to, but is not absolutely limited to, a PTC ceramic thermosensitive element based on barium lead titanate [(Ba, Pb) TiO$_3$]. PTC thermosensitive element is a polycrystalline ceramic element prepared through high-temperature sintering. Its PTC thermosensitive effect originates from grain boundaries, and its performance is greatly affected by external environmental atmosphere. For example, when the PTC thermosensitive element works in harsh environments such as reducing atmospheres for a long time, it can easily lead to a decrease or even disappearance of PTC performance. Typical examples of use in the harsh environments include PTC thermosensitive elements for lithium battery heating systems in new energy vehicles.

"Positive Temperature Coefficient Thermistor Element with Strong Resistance to Reducing Atmosphere and Method for Preparing the Same" recommended by CN112802674B is proposed to eliminate the defects and aim for long-term and stable service in harsh environments such as reducing atmosphere. "Method for Improving Resistance of Ceramic PTC Thermosensitive Element to Reduction" provided by CN113265636A is also proposed for the same purpose as CN112802674B. The former of the two patents enhances the anti-reduction performance by modifying the thermosensitive material based on barium lead titanate, and arranges a self-developed K$_2$SiF$_6$—Zn—Al$_2$—Si micro glass film on the surface of the PTC element, or coats a silicon-based organic sealing layer on the surface of the PTC element to block the connection between the ceramic body and the external environment and improve the anti-reduction performance. The latter of the two patents uses vacuum sputtering to form a thin film of an inorganic material on the surface of PTC thermosensitive element to block the connection between the ceramic body and the external environment and improve the anti-reduction performance.

However, CN112802674B requires specialized development and research of the coating materials used, namely inorganic glass and organic coatings, making it relatively difficult to prepare and leading to high product costs, which creates a bottleneck factor for the market with a wide range and large volume. CN113265636A has significant constraints on industrial and efficient mass production due to its low production efficiency, reliance on expensive equipment, and limited suitability for small-sized products. In view of the above, exploring more effective PTC thermosensitive elements and significantly blocking harmful gases such as reducing gases from invading ceramic grain boundaries to effectively extend the service life of PTC thermosensitive elements in reducing atmosphere environments are of positive significance. The technical solution to be introduced below is developed in this context.

SUMMARY

The purpose of the present disclosure is to provide a method for improving anti-reduction performance of a PTC thermosensitive element, the method helps to simplify the process and reduce the manufacturing cost by abandoning the use of self-developed inorganic glass or organic coatings obtained through complex preparation processes as coating materials, facilitates sealing surface defects such as pores and cracks of any PTC thermosensitive element based on barium lead titanate to form an ideal isolation protective layer that effectively prevents harmful gases such as reducing gases from entering grain boundaries, and is beneficial for significantly improving the manufacturing efficiency to meet the requirements of industrial scale production.

The task of the present disclosure is achieved by adopting the following technical solution: a method for improving anti-reduction performance of a PTC thermosensitive element, including coating an inorganic protective layer, organic protective layer, or organic and inorganic composite protective layer coated with a mixture of an inorganic substance and an organic substance for blocking harmful reducing gases from entering an interior of a ceramic body through surface defects or grain boundaries of the ceramic body onto the surface of a PTC thermosensitive element based on barium lead titanate.

In a specific example of the present disclosure, the thickness of the inorganic protective layer is less than 5 microns.

In another specific example of the present disclosure, the thickness of the organic protective layer is less than 5 microns.

In another specific example of the present disclosure, the thickness of the organic and inorganic composite protective layer coated with the mixture of the inorganic substance and the organic substance is less than 5 microns.

In another specific example of the present disclosure, the inorganic protective layer is a glass film layer or a metal oxide film layer, and the glass film layer is formed by coating a slurry prepared from glass onto the surface of the PTC thermosensitive element that has undergone surface cleaning treatment through any one of spray-coating, printing, impregnation and sputtering, and then performing high-temperature sintering and infiltration; the metal oxide film layer is formed by sputtering an oxide of a metal oxide target onto the surface of the PTC thermosensitive element through a sputtering method, and then performing heat treatment; a method for the surface cleaning treatment includes cleaning and drying after cleaning; the cleaning is performed by using a cleaning agent, and the cleaning agent is deionized water; the metal oxide is Al$_2$O$_3$, SiO$_2$ or CaO$_2$; the temperature for the heat treatment is 300-500° C., and the time for the heat treatment is 30-60 min.

In another specific example of the present disclosure, the temperature for the high-temperature sintering and infiltration is 550-800° C., and the temperature is increased at speed of 250° C./h from room temperature to a softening point of the glass, is held for 10-30 min, and then is naturally decreased to room temperature.

In another specific example of the present disclosure, the organic protective layer is either an organic silicon sealing material layer or an insulating paint layer, and the organic silicon sealing material layer is formed by coating a prepared slurry onto the surface of the PTC thermosensitive element that has undergone surface cleaning treatment through any one of spray-coating, printing, vacuum deposition and isostatic pressing, and then performing drying and curing; the temperature for the drying and curing is 150-250° C.

In another specific example of the present disclosure, the organic silicon sealing material layer is composed of the following raw materials in parts by weight: 1 part of organic silicon material, 1-5 parts of crosslinking agent, 0.05-0.5 parts of catalyst, and 0.05-0.5 parts of auxiliary agent; the organic silicon material is one or more of silicone oil, silicone gel, silicone rubber and silicone resin; the cross-linking agent is ethyl orthosilicate, propyl orthosilicate, perbenzoic acid, MEKP, acetylsilane or acylaminosilane; the catalyst is a dibutyltin dilaurate or vinyl platinum complex; the auxiliary agent is a nano inorganic filler, and the nano inorganic filler is silicon dioxide or aluminum oxide.

In another specific example of the present disclosure, the insulating paint layer is acrylic paint, polyurethane paint, amino paint or epoxy resin paint.

In another specific example of the present disclosure, the organic and inorganic composite protective layer coated with the mixture of the inorganic substance and the organic substance is formed by coating a prepared slurry onto the surface of the PTC thermosensitive element that has under-gone surface cleaning treatment and drying after the surface cleaning treatment through spray-coating, printing, vacuum impregnation or isostatic pressing, and then performing drying and curing at 150-250° C., the organic and inorganic composite protective layer coated with the mixture of the inorganic substance and the organic substance is a mixture of a metal oxide and an organic silicon sealing material mixed in a weight ratio of 1:1, or a mixture of a metal oxide and insulating paint mixed in a weight ratio of 1:1; the metal oxide is $Al_2O_3$, $SiO_2$, or $TiO_2$, and the organic silicon sealing material is composed of the following raw materials in parts by weight: 1 part of organic silicon material, 1-5 parts of crosslinking agent, 0.05-0.5 parts of catalyst, and 0.05-0.5 parts of auxiliary agent; the insulating paint is acrylic paint, polyurethane paint, amino paint or epoxy resin paint; the organic silicon material is one or more of silicone oil, silicone gel, silicone rubber and silicone resin; the cross-linking agent is ethyl orthosilicate, propyl orthosilicate, perbenzoic acid, MEKP (methyl ethyl ketone peroxide), acetylsilane or acylaminosilane; the catalyst is a dibutyltin dilaurate or vinyl platinum complex; the auxiliary agent is a nano inorganic filler, and the nano inorganic filler is silicon dioxide or aluminum oxide.

The technical solution provided by the present disclosure has the following technical effects: by coating the inorganic protective layer, organic protective layer, or organic and inorganic composite protective layer coated with the mixture of the inorganic substance and the organic substance onto the surface of the PTC thermosensitive element based on barium lead titanate to form an isolation protective layer for blocking reducing harmful gases from entering the interior of the ceramic body through the surface defects or grain boundaries of the ceramic body, on the one hand, it elimi-nates the constraint of using self-developed inorganic glass or organic coatings obtained through complex and rigorous preparation processes as coating materials, and not only simplifies the preparation process, but also reduces the preparation cost, and on the other hand, it can significantly improve the manufacturing efficiency to meet the require-ments of industrial scale production.

BRIEF DESCRIPTION OF FIGURES

FIG. 1 is a schematic diagram of a reducing atmosphere test apparatus for a PTC thermosensitive element obtained by adopting a method according to the present disclosure and a conventional uncoated PTC thermosensitive element.

4

DETAILED DESCRIPTION

Example 1

An inorganic protective layer for blocking harmful reduc-ing gases from entering an interior of a ceramic body through surface defects or grain boundaries (also known as crystal boundaries) of the ceramic body was coated onto the surface of a PTC thermosensitive element based on barium lead titanate. The surface defects of the ceramic body were not limited to microcracks and/or micropores. The inorganic protective layer was a glass film layer. The glass film layer was formed of a slurry prepared from glass. A specific implementation process was as follows: glass powder, an adhesive, a curing agent and a diluent were proportioned and uniformly mixed in a mass percentage ratio of 82%:12%: 2%:4%, the slurry was coated, namely bound, onto the surface of a PTC thermosensitive element that had under-gone surface cleaning treatment by using deionized water as a cleaning agent in advance and then drying after the surface cleaning treatment through spray-coating or screen printing, and then high-temperature sintering and infiltration were performed at temperature of 550° C. In the high-temperature sintering and infiltration process, the temperature was increased to a softening point of the glass from room temperature at speed of 250° C./h, was held at this softening point for 30 min, and then was naturally decreased to room temperature, thus obtaining a PTC thermosensitive element coated with the glass film layer with a thickness of 3 microns as the inorganic protective layer and a good isolation and protection effect of effectively preventing harmful gases such as external reducing gases from entering the interior of the ceramic body.

The glass powder was commercially available glass pow-der with a softening point of 550° C. and a particle size of less than 500 nanometers. The adhesive was bisphenol A epoxy resin. The curing agent was an acid anhydride curing agent. The diluent was an active diluent 692.

Example 2

An inorganic protective layer for blocking harmful reduc-ing gases from entering an interior of a ceramic body through surface defects or grain boundaries (also known as crystal boundaries) of the ceramic body was coated onto the surface of a PTC thermosensitive element based on barium lead titanate. The surface defects of the ceramic body were not limited to microcracks and/or micropores. The inorganic protective layer was a metal oxide film layer. The metal oxide film layer was formed by sputtering, namely binding, an oxide of a metal oxide target onto the surface of a PTC thermosensitive element that had undergone surface clean-ing treatment by using deionized water as a cleaning agent in advance and then drying after the surface cleaning treat-ment through sputtering, and then heat treatment was per-formed at temperature of 450° C. for 45 min, thus obtaining a PTC thermosensitive element coated with the metal oxide film layer with a thickness of 1 micron as the inorganic protective layer and a good isolation and protection effect of effectively preventing harmful gases such as external reduc-ing gases from entering the interior of the ceramic body. In this example, the metal oxide was $Al_2O_3$.

Example 3

Only the spray-coating or printing was changed to impregnation, the softening temperature of the glass powder was changed to 800° C., the sintering and infiltration temperature was changed to 800° C., the temperature holding time was changed to 10 min, and the thickness of the glass film layer was changed to 5 microns. Other conditions were the same as those described in Example 1.

Example 4

Only the heat treatment temperature was changed to 300° C., the heat treatment time was changed to 60 min, the metal oxide was changed to $SiO_2$, and the thickness of the metal oxide film layer was changed to 0.5 microns. Other conditions were the same as those described in Example 2.

Example 5

Only the sintering and infiltration temperature was changed to 630° C., the temperature holding time was changed to 20 min, and the thickness of the glass film layer was changed to 1 micron. Other conditions were the same as those described in Example 1.

Example 6

Only the heat treatment temperature was changed to 500° C., the heat treatment time was changed to 30 min, and the metal oxide was changed to $CaO_2$. Other conditions were the same as those described in Example 2.

Example 7

An organic protective layer for blocking harmful reducing gases from entering an interior of a ceramic body through surface defects or grain boundaries (also known as crystal boundaries) of the ceramic body was coated onto the surface of a PTC thermosensitive element based on barium lead titanate. The surface defects of the ceramic body were not limited to microcracks and/or micropores. The organic protective layer was an organic silicon sealing material layer. The organic silicon sealing material layer was formed by coating, namely binding, a prepared slurry onto the surface of a PTC thermosensitive element that had undergone surface cleaning treatment by using deionized water as a cleaning agent in advance and then drying after the surface cleaning treatment through isostatic pressing, and then drying and curing were performed at temperature of 150° C., thus obtaining a PTC thermosensitive element coated with the organic silicon sealing material layer with a thickness of 1 micron as the organic protective layer and a good isolation and protection effect of effectively preventing harmful gases such as external reducing gases from entering the interior of the ceramic body. In this example, the organic silicon sealing material layer was composed of the following raw materials in parts by weight: 1 part of silicone oil, 5 parts of ethyl orthosilicate, 0.5 parts of dibutyltin dilaurate, and 0.05 parts of nano inorganic filler, namely silicon dioxide.

Example 8

Only the isostatic pressing method was changed to vacuum impregnation, the drying and curing temperature was changed to 250° C., the thickness of the surface coating layer, i.e. the organic silicon sealing material layer, was changed to 5 microns, and the organic silicon sealing material layer was changed to be composed of the following raw materials in parts by weight: 0.5 parts of silicone gel and silicone rubber, 5 parts of perbenzoic acid, 0.05 parts of vinyl platinum complex, and 0.5 parts of nano inorganic filler, namely aluminum oxide. Other conditions were the same as those described in Example 7.

Example 9

An organic protective layer for blocking harmful reducing gases from entering an interior of a ceramic body through surface defects or grain boundaries (also known as crystal boundaries) of the ceramic body was coated onto the surface of a PTC thermosensitive element based on barium lead titanate. The surface defects of the ceramic body were not limited to microcracks and/or micropores. The organic protective layer was an insulating paint layer. The insulating paint layer was formed by coating, namely binding, a prepared slurry onto the surface of a PTC thermosensitive element that had undergone surface cleaning treatment by using deionized water as a cleaning agent in advance and then drying after the surface cleaning treatment through printing (or spray-coating), and then drying and curing were performed at temperature of 200° C., thus obtaining a PTC thermosensitive element coated with the insulating paint layer with a thickness of 3 microns as the organic protective layer and a good isolation and protection effect of effectively preventing harmful gases such as external reducing gases from entering the interior of the ceramic body. In this example, the insulating paint layer was acrylic paint, but it might also be polyurethane paint, amino paint, or epoxy resin paint, and the thickness of the paint layer might be reasonably selected within the range of less than 5 microns as needed.

Example 10

An organic and inorganic composite protective layer coated with a mixture of an inorganic substance and an organic substance for blocking harmful reducing gases from entering an interior of a ceramic body through surface defects (such as microcracks and/or micropores) or grain boundaries (also known as crystal boundaries) of the ceramic body was coated onto the surface of a PTC thermosensitive element based on barium lead titanate. The organic and inorganic composite protective layer was formed by coating a prepared slurry onto the surface of a PTC thermosensitive element that had undergone surface cleaning treatment by using deionized water as a cleaning agent in advance and then drying after the surface cleaning treatment through vacuum deposition or isostatic pressing, and then drying and curing were performed at temperature of 150-250° C., thus obtaining a PTC thermosensitive element coated, namely bound with the organic and inorganic composite protective layer with a thickness of less than 5 microns and an effect of preventing harmful gases such as external reducing gases from entering the interior of the ceramic body. In this example, the organic and inorganic composite protective layer was coated with a mixture of a metal oxide and an organic silicon sealing material mixed in a weight ratio of 1:1, the metal oxide was $Al_2O_3$, $SiO_2$ or $TiO_2$, the organic silicon sealing material was composed of the following raw materials in parts by weight: 1 part of one or more of silicone oil, silicone gel, silicone rubber and silicone resin as an organic silicon material, 1-5 parts of ethyl orthosilicate, propyl orthosilicate, perbenzoic acid, MEKP (methyl ethyl ketone peroxide), acetylsilane or acylaminosilane as a crosslinking agent, 0.05-0.5 parts of dibutyl tin dilaurate or vinyl platinum complex as a catalyst, and nano inorganic filler, namely silicon dioxide or aluminum oxide as an auxiliary agent.

Example 11

An organic and inorganic composite protective layer coated with a mixture of an inorganic substance and an organic substance for blocking harmful reducing gases from entering an interior of a ceramic body through surface defects (such as microcracks and/or micropores) or grain boundaries of the ceramic body was coated onto the surface of a PTC thermosensitive element based on barium lead batch. Half of them were subjected to the coating treatment in the present disclosure, while the other half were not treated at all. Both kinds of products were subjected to anti-reduction performance testing in an anti-reduction performance testing system at the same time. Comparative test results were recorded and examined. The comparative results are as shown in the following table:

Performance Test Table of PTC Thermosensitive Elements Obtained in Example 1 to Example 11 of the Present Disclosure and Conventional Uncoated PTC Thermosensitive Elements

| Test item | PTC thermosensitive elements obtained in examples of the present disclosure | | | | | | | | | | | Conventional uncoated PTC thermosensitive elements |
| --- | --- | --- | --- | --- | --- | --- | --- | --- | --- | --- | --- | --- |
| | 1 | 2 | 3 | 4 | 5 | 6 | 7 | 8 | 9 | 10 | 11 | |
| Resistance value (kΩ) | 3.5 | 3.0 | 2.9 | 3.2 | 2.6 | 2.7 | 3.4 | 3.1 | 3.5 | 2.6 | 2.5 | 3.2 |
| Breakdown time (min) | >1440 | >1440 | >1440 | >1440 | >1440 | >1440 | >1440 | >1440 | >1440 | >1440 | >1440 | ≤60 | titanate. The organic and inorganic composite protective layer was formed by coating a prepared slurry onto the surface of a PTC thermosensitive element that had undergone surface cleaning treatment by using deionized water as a cleaning agent in advance and then drying after the surface cleaning treatment through spray-coating or printing, and then drying and curing were performed at temperature of 150-250° C., thus obtaining a PTC thermosensitive element coated, namely bound with the organic and inorganic composite protective layer with a thickness of less than 5 microns and an effect of preventing harmful gases such as external reducing gases from entering the interior of the ceramic body. In this example, the organic and inorganic composite protective layer was prepared from a mixture of a metal oxide and insulating paint mixed in a weight ratio of 1:1, the metal oxide was $Al_2O_3$, $SiO_2$ or $TiO_2$, and the insulating paint was acrylic paint, polyurethane paint, amino paint or epoxy resin paint.

Please refer to FIG. 1. Reference signs in FIG. 1 are as follows: 1—ceramic body, 2—electrode on the surface of ceramic body, 3—regulated power supply, 4—vacuum pump, 5—vacuum container, and 6—reducing solvent. The volume of vacuum container 5 was about 1000 m³. 50 g of acetone agent (i.e., reducing solvent 6) with a mass percentage of 100% were put in the vacuum container 5.

The apparatus shown in FIG. 1 was used for anti-reduction performance testing. A PTC thermosensitive element sample to be tested, namely a ceramic body 1 with an electrode 2 attached to the surface, was placed in the reducing solvent 6 in the vacuum container 5. The pressure in the vacuum container 5 was pumped to 20 KPa (negative pressure) by using the vacuum pump 4. 270 V power frequency voltage was continuously applied to the PTC thermosensitive element until the element failed, and the time of failure was recorded.

A specific implementation process was as follows: elements with similar zero power resistance values at room temperature were selected from PTC thermosensitive elements based on barium lead titanate prepared in the same

What is claimed is:

1. A method for improving anti-reduction performance of a PTC thermosensitive element, comprising coating an inorganic protective layer, organic protective layer, or organic and inorganic composite protective layer coated with a mixture of an inorganic substance and an organic substance for blocking harmful reducing gases from entering an interior of a ceramic body of the PTC thermosensitive element through surface defects or grain boundaries of the ceramic body onto a surface of the ceramic body of the PTC thermosensitive element;

wherein the organic and inorganic composite protective layer coated with the mixture of the inorganic substance and the organic substance is formed by coating a prepared slurry onto the surface of the PTC thermosensitive element that has undergone surface cleaning treatment and drying after the surface cleaning treatment through spray-coating, printing, vacuum impregnation or isostatic pressing, and then performing drying and curing at 150-250° C., the organic and inorganic composite protective layer coated with the mixture of the inorganic substance and the organic substance is a mixture of a metal oxide and an organic silicon sealing material mixed in a weight ratio of 1:1, or a mixture of a metal oxide and insulating paint mixed in a weight ratio of 1:1; the metal oxide is $Al_2O_3$, $SiO_2$, or $TiO_2$, and the organic silicon sealing material is composed of the following raw materials in parts by weight: 1 part of organic silicon material, 1-5 parts of crosslinking agent, 0.05-0.5 parts of catalyst, and 0.05-0.5 parts of auxiliary agent; the insulating paint is acrylic paint, polyurethane paint, amino paint or epoxy resin paint; the organic silicon material is one or more of silicone oil, silicone gel, silicone rubber and silicone resin; the crosslinking agent is ethyl orthosilicate, propyl orthosilicate, perbenzoic acid, MEKP, acetylsilane or acylaminosilane; the catalyst is a dibutyltin dilaurate or vinyl platinum complex; the auxiliary agent is a nano inorganic filler, and the nano inorganic filler is silicon dioxide or aluminum oxide.

2. The method for improving anti-reduction performance of a PTC thermosensitive element according to claim 1, wherein the thickness of the inorganic protective layer is less than 5 microns.

3. The method for improving anti-reduction performance of a PTC thermosensitive element according to claim 1, wherein the thickness of the organic protective layer is less than 5 microns.

4. The method for improving the anti-reduction performance of the PTC thermosensitive element according to claim 1, wherein the thickness of the organic and inorganic composite protective layer coated with the mixture of the inorganic substance and the organic substance is less than 5 microns.

5. The method for improving anti-reduction performance of a PTC thermosensitive element according to claim 1, wherein the inorganic protective layer is a glass film layer or a metal oxide film layer, and the glass film layer is formed by coating a slurry prepared from glass onto the surface of the PTC thermosensitive element that has undergone surface cleaning treatment through any one of spray-coating, printing, impregnation and sputtering, and then performing high-temperature sintering and infiltration; the metal oxide film layer is formed by sputtering an oxide of a metal oxide target onto the surface of the PTC thermosensitive element through a sputtering method, and then performing heat treatment; a method for the surface cleaning treatment comprises cleaning and drying after cleaning; the cleaning is performed by using a cleaning agent, and the cleaning agent is deionized water; the metal oxide is $Al_2O_3$, $SiO_2$ or $CaO_2$; the temperature for the heat treatment is 300-500° C., and the time for the heat treatment is 30-60 min.

6. The method for improving anti-reduction performance of a PTC thermosensitive element according to claim 2, wherein the inorganic protective layer is a glass film layer or a metal oxide film layer, and the glass film layer is formed by coating a slurry prepared from glass onto the surface of the PTC thermosensitive element that has undergone surface cleaning treatment through any one of spray-coating, printing, impregnation and sputtering, and then performing high-temperature sintering and infiltration; the metal oxide film layer is formed by sputtering an oxide of a metal oxide target onto the surface of the PTC thermosensitive element through a sputtering method, and then performing heat treatment; a method for the surface cleaning treatment comprises cleaning and drying after cleaning; the cleaning is performed by using a cleaning agent, and the cleaning agent is deionized water; the metal oxide is $Al_2O_3$, $SiO_2$ or $CaO_2$; the temperature for the heat treatment is 300-500° C., and the time for the heat treatment is 30-60 min.

7. The method for improving anti-reduction performance of a PTC thermosensitive element according to claim 5, wherein the temperature for the high-temperature sintering and infiltration is 550-800° C., and the temperature is increased at speed of 250° C./h from room temperature to a softening point of the glass, is held for 10-30 min, and then is naturally decreased to room temperature.

8. The method for improving anti-reduction performance of a PTC thermosensitive element according to claim 1, wherein the organic protective layer is either an organic silicon sealing material layer or an insulating paint layer, and the organic silicon sealing material layer is formed by coating a prepared slurry onto the surface of the PTC thermosensitive element that has undergone surface cleaning treatment through any one of spray-coating, printing, vacuum impregnation and isostatic pressing, and then performing drying and curing; the temperature for the drying and curing is 150-250° C.

9. The method for improving anti-reduction performance of a PTC thermosensitive element according to claim 3, wherein the organic protective layer is either an organic silicon sealing material layer or an insulating paint layer, and the organic silicon sealing material layer is formed by coating a prepared slurry onto the surface of the PTC thermosensitive element that has undergone surface cleaning treatment through any one of spray-coating, printing, vacuum impregnation and isostatic pressing, and then performing drying and curing; the temperature for the drying and curing is 150-250° C.

10. The method for improving anti-reduction performance of a PTC thermosensitive element according to claim 8, wherein the insulating paint layer is acrylic paint, polyurethane paint, amino paint or epoxy resin paint.

11. A method for improving anti-reduction performance of a PTC thermosensitive element, comprising coating an inorganic protective layer, organic protective layer, or organic and inorganic composite protective layer coated with a mixture of an inorganic substance and an organic substance for blocking harmful reducing gases from entering an interior of a ceramic body of a PTC thermosensitive element through surface defects or grain boundaries of the ceramic body onto a surface of the ceramic body of the PTC thermosensitive element;

wherein the inorganic protective layer is a glass film layer or a metal oxide film layer, and the glass film layer is formed by coating a slurry prepared from glass onto the surface of the PTC thermosensitive element that has undergone surface cleaning treatment through any one of spray-coating, printing, impregnation and sputtering, and then performing high-temperature sintering and infiltration; the metal oxide film layer is formed by sputtering an oxide of a metal oxide target onto the surface of the PTC thermosensitive element through a sputtering method, and then performing heat treatment; a method for the surface cleaning treatment comprises cleaning and drying after cleaning; the cleaning is performed by using a cleaning agent, and the cleaning agent is deionized water; the metal oxide is $Al_2O_3$, $SiO_2$ or $CaO_2$; the temperature for the heat treatment is 300-500° C., and the time for the heat treatment is 30-60 min;

wherein the temperature for the high-temperature sintering and infiltration is 550-800° C., and the temperature is increased at speed of 250° C./h from room temperature to a softening point of the glass, is held for 10-30 min, and then is naturally decreased to room temperature;

wherein the organic silicon sealing material layer is composed of the following raw materials in parts by weight: 1 part of organic silicon material, 1-5 parts of crosslinking agent, 0.05-0.5 parts of catalyst, and 0.05-0.5 parts of auxiliary agent; the organic silicon material is one or more of silicone oil, silicone gel, silicone rubber and silicone resin; the crosslinking agent is ethyl orthosilicate, propyl orthosilicate, perbenzoic acid, MEKP, acetylsilane or acylaminosilane; the catalyst is a dibutyltin dilaurate or vinyl platinum complex; the auxiliary agent is a nano inorganic filler, and the nano inorganic filler is silicon dioxide or aluminum oxide.

12. A method for improving anti-reduction performance of a PTC thermosensitive element, comprising coating an inorganic protective layer, organic protective layer, or organic and inorganic composite protective layer coated with a mixture of an inorganic substance and an organic substance for blocking harmful reducing gases from entering an interior of a ceramic body of a PTC thermosensitive element through surface defects or grain boundaries of the ceramic body onto a surface of the ceramic body of the PTC thermosensitive element;

wherein the thickness of the organic and inorganic composite protective layer coated with the mixture of the inorganic substance and the organic substance is less than 5 microns;

wherein the organic and inorganic composite protective layer coated with the mixture of the inorganic substance and the organic substance is formed by coating a prepared slurry onto the surface of the PTC thermosensitive element that has undergone surface cleaning treatment and drying after the surface cleaning treatment through spray-coating, printing, vacuum impregnation or isostatic pressing, and then performing drying and curing at 150-250° C., the organic and inorganic composite protective layer coated with the mixture of the inorganic substance and the organic substance is a mixture of a metal oxide and an organic silicon sealing material mixed in a weight ratio of 1:1, or a mixture of a metal oxide and insulating paint mixed in a weight ratio of 1:1; the metal oxide is $Al_2O_3$, $SiO_2$, or $TiO_2$, and the organic silicon sealing material is composed of the following raw materials in parts by weight: 1 part of organic silicon material, 1-5 parts of crosslinking agent, 0.05-0.5 parts of catalyst, and 0.05-0.5 parts of auxiliary agent; the insulating paint is acrylic paint, polyurethane paint, amino paint or epoxy resin paint; the organic silicon material is one or more of silicone oil, silicone gel, silicone rubber and silicone resin; the crosslinking agent is ethyl orthosilicate, propyl orthosilicate, perbenzoic acid, MEKP, acetylsilane or acylaminosilane; the catalyst is a dibutyltin dilaurate or vinyl platinum complex; the auxiliary agent is a nano inorganic filler, and the nano inorganic filler is silicon dioxide or aluminum oxide.

\* \* \* \* \*